United States Patent
Eichler et al.

(10) Patent No.: US 8,093,607 B2
(45) Date of Patent: Jan. 10, 2012

(54) OPTOELECTRONIC SEMICONDUCTOR COMPONENT

(75) Inventors: Christoph Eichler, Tegernheim (DE); Stephan Miller, Pentling (DE); Uwe Strauss, Bad Abbach (DE); Volker Härle, Laaber (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 49 days.

(21) Appl. No.: 12/298,703

(22) PCT Filed: Apr. 25, 2007

(86) PCT No.: PCT/DE2007/000740
§ 371 (c)(1),
(2), (4) Date: Mar. 2, 2009

(87) PCT Pub. No.: WO2007/121739
PCT Pub. Date: Nov. 1, 2007

(65) Prior Publication Data
US 2009/0309113 A1    Dec. 17, 2009

(30) Foreign Application Priority Data

Apr. 25, 2006  (DE) .................. 10 2006 019 109
Jun. 30, 2006  (DE) .................. 10 2006 030 252
Dec. 22, 2006  (DE) .................. 10 2006 061 167

(51) Int. Cl.
*H01L 33/42* (2010.01)

(52) U.S. Cl. .................. 257/98; 257/E33.069

(58) Field of Classification Search .................. 257/98, 257/E33.069
See application file for complete search history.

(56) References Cited

U.S. PATENT DOCUMENTS

| | | | |
|---|---|---|---|
| 5,374,562 A | 12/1994 | Simon | |
| 5,374,564 A | 12/1994 | Bruel | |
| 6,111,272 A | 8/2000 | Heinen | |
| 6,150,239 A | 11/2000 | Goesele et al. | |
| 6,150,564 A | 11/2000 | Bröcker et al. | |
| 6,172,382 B1 | 1/2001 | Nagahama et al. | |
| 6,320,206 B1 * | 11/2001 | Coman et al. | 257/94 |
| 6,617,061 B2 | 9/2003 | Koike et al. | |
| 6,631,149 B1 | 10/2003 | Tezen et al. | |
| 6,649,440 B1 * | 11/2003 | Krames et al. | 438/47 |
| 6,657,234 B1 | 12/2003 | Tanizawa | |
| 6,738,175 B2 | 5/2004 | Morita et al. | |

(Continued)

FOREIGN PATENT DOCUMENTS

DE           19640594 A1    4/1998
(Continued)

OTHER PUBLICATIONS

English Translation of Taiwanese Office Action dated Mar. 1, 2011.

*Primary Examiner* — Benjamin Sandvik
*Assistant Examiner* — Wensing Kuo
(74) *Attorney, Agent, or Firm* — Cozen O'Connor

(57) ABSTRACT

An optoelectronic semiconductor component, comprising a carrier substrate, and an interlayer that mediates adhesion between the carrier substrate and a component structure. The component structure comprises an active layer provided for generating radiation, and a useful layer arranged between the interlayer and the active layer. The useful layer has a separating area remote from the carrier substrate.

12 Claims, 5 Drawing Sheets

U.S. PATENT DOCUMENTS

| | | |
|---|---|---|
| 6,878,563 B2 | 4/2005 | Bader et al. |
| 6,979,582 B2 | 12/2005 | Horng et al. |
| 2002/0050601 A1 | 5/2002 | Saeki et al. |
| 2003/0020061 A1 | 1/2003 | Emerson et al. |
| 2003/0062080 A1* | 4/2003 | Satoh et al. .................... 136/256 |
| 2003/0104678 A1 | 6/2003 | Kelly et al. |
| 2003/0116791 A1 | 6/2003 | Baptist et al. |
| 2003/0141496 A1 | 7/2003 | Illek et al. |
| 2003/0153163 A1 | 8/2003 | Letertre et al. |
| 2004/0033638 A1 | 2/2004 | Bader et al. |
| 2004/0151221 A1 | 8/2004 | Yamamoto et al. |
| 2004/0160657 A1 | 8/2004 | Tonar et al. |
| 2004/0188791 A1 | 9/2004 | Horng et al. |
| 2004/0245543 A1 | 12/2004 | Yoo |
| 2005/0017254 A1 | 1/2005 | Lin et al. |
| 2005/0032383 A1 | 2/2005 | Horng et al. |
| 2005/0145871 A1 | 7/2005 | Fukuda et al. |
| 2005/0242365 A1 | 11/2005 | Yoo |
| 2005/0247950 A1 | 11/2005 | Nakamura et al. |
| 2005/0282358 A1 | 12/2005 | Di Cioccio et al. |
| 2006/0172506 A1 | 8/2006 | Bruederl et al. |
| 2006/0211159 A1 | 9/2006 | Bruederl et al. |
| 2007/0175384 A1 | 8/2007 | Bruederl et al. |
| 2009/0117711 A1 | 5/2009 | Harle et al. |
| 2009/0206348 A1 | 8/2009 | Harle et al. |
| 2009/0290610 A1 | 11/2009 | Eichler et al. |
| 2009/0315048 A1 | 12/2009 | Fehrer et al. |

FOREIGN PATENT DOCUMENTS

| | | |
|---|---|---|
| DE | 102004030603 A1 | 2/2005 |
| DE | 102004062290 A1 | 7/2006 |
| DE | 102005052357 A1 | 3/2007 |
| DE | 102005052358 A1 | 3/2007 |
| DE | 102006007293 A1 | 8/2007 |
| DE | 102006015788 A1 | 9/2007 |
| EP | 0905797 A2 | 3/1999 |
| EP | 1063711 A1 | 3/1999 |
| EP | 1 202 355 | 5/2002 |
| EP | 1453160 A1 | 9/2004 |
| FR | 2 809 534 | 11/2001 |
| WO | WO 00/59046 | 10/2000 |
| WO | WO 02/13281 | 2/2002 |
| WO | WO 03/005459 | 1/2003 |
| WO | WO 2004/007816 A1 | 1/2004 |
| WO | WO 2004/010494 A2 | 1/2004 |
| WO | WO 2005/004231 A1 | 1/2005 |
| WO | WO 2006/116030 | 11/2006 |
| WO | WO 2008/089739 A1 | 7/2008 |

* cited by examiner

US 8,093,607 B2

OPTOELECTRONIC SEMICONDUCTOR COMPONENT

RELATED APPLICATIONS

This is a U.S. national stage under 35 USC §371 of application No. PCT/DE2007/000740, filed on Apr. 25, 2007.

This application claims the priority of German application no. 10 2006 019 109.9 filed Apr. 25, 2006, DE 10 2006 030 252.4 filed Jun. 30, 2006 and 10 2006 061 167.5 filed Dec. 22, 2006, the entire content of all of which is hereby incorporated by reference.

FIELD OF THE INVENTION

Background of the Invention

An optoelectronic semiconductor component is specified.
The document DE 19640594 and the document US 2005/0247950 describe optoelectronic semiconductor components and methods for producing them.

SUMMARY OF THE INVENTION

One object of the present invention is to provide an optoelectronic semiconductor component which has a particularly high lifetime. A further object is to provide an optoelectronic semiconductor component which has a particularly high efficiency. A further object is to provide a method for producing such an optoelectronic semiconductor component.

The optoelectronic semiconductor component described here is for example a luminescence diode, that is to say a light emitting diode or a laser diode. In particular, the optoelectronic semiconductor component can also be an RCLED (resonant cavity light emitting diode) or a VCSEL (vertical cavity surface emitting laser).

In accordance with at least one embodiment of the optoelectronic semiconductor component, the optoelectronic component has a carrier substrate. The functional layers of the optoelectronic semiconductor component—that is to say a component structure of the optoelectronic semiconductor component that comprises an active layer provided for generating radiation—are mechanically fixedly connected to the carrier substrate. It is furthermore possible for electrical contact to be able to be made with the component structure of the optoelectronic component via the carrier substrate. Preferably, the carrier substrate in this case is not a growth substrate on which the component structure of the optoelectronic semiconductor component is deposited epitaxially, but rather a substrate to which the component structure is applied after it has been produced, or to which a useful layer is applied, onto which the component structure is deposited epitaxially after application.

In accordance with at least one embodiment of the optoelectronic semiconductor component, the optoelectronic semiconductor component comprises an interlayer that mediates adhesion between the carrier substrate and the component structure of the optoelectronic semiconductor component. The interlayer can be a bonding layer, for example, by means of which the carrier substrate is bonded onto the component structure. Furthermore, it is possible for the interlayer to mechanically connect the carrier substrate to a useful layer. The component structure can then be grown epitaxially onto that side of the useful layer which is remote from the carrier substrate.

In accordance with at least one embodiment of the optoelectronic semiconductor component, the optoelectronic semiconductor component comprises a component structure having an active layer provided for generating radiation. Preferably, the active layer is suitable for generating electromagnetic radiation in the blue and/or ultraviolet spectral range. The active layer can comprise a plurality of semiconductor layers for this purpose. By way of example, the active layer comprises a pn junction, a heterostructure, a single quantum well structure and/or a multiple quantum well structure. The designation quantum well structure also encompasses, in particular, any structure in which charge carriers can experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

In accordance with at least one embodiment of the optoelectronic semiconductor component, the optoelectronic semiconductor component comprises a carrier substrate, an interlayer that mediates adhesion between the carrier substrate and a component structure, wherein the component structure comprises an active layer provided for generating radiation.

In accordance with at least one embodiment of the optoelectronic semiconductor component, the component structure has a useful layer. The useful layer is connected to the carrier substrate by means of the interlayer. The component structure is grown epitaxially onto that side of the useful layer which is remote from the carrier substrate. That is to say that the component structure with the active layer succeeds the useful layer in the growth direction. Preferably, the useful layer consists of GaN having a particularly low dislocation density. In this case, the dislocation density is preferably less than $10^8$ per $cm^2$, particularly preferably less than $10^7$ per $cm^2$. In other words, the useful layer is for example a layer composed of high-quality, low-defect semiconductor materials such as GaN. By contrast, the carrier substrate can be formed from a more cost-effective material, for example defect-rich GaN.

In accordance with at least one embodiment of the optoelectronic semiconductor component, the useful layer has a separating area remote from the carrier substrate. The useful layer is released for example from a thicker useful substrate along the separating area. The separating area is preferably planarized and overgrown epitaxially. By way of example, the component structure is deposited epitaxially onto this planarized separating area.

In accordance with at least one embodiment of the optoelectronic semiconductor component, the interlayer is electrically insulating. For this purpose, the interlayer can consist of a silicon nitride or a silicon oxide or contain at least one of these materials. By way of example, the interlayer in this case contains at least one of the following materials: SiN, $SiO_2$, $Si_3N_4$, $Al_2O_3$, $Ta_2O_5$, $HfO_2$.

In accordance with at least one embodiment of the optoelectronic semiconductor component, the interlayer comprises at least one oxide, nitride and/or fluoride of at least one of the following elements: Si, Mg, Al, Hf, Nb, Zr, Sc, Ta, Ga, Zn, Y, B, Ti.

In accordance with at least one embodiment of the optoelectronic semiconductor component, the interlayer consists of an oxygen-containing compound.

In accordance with at least one embodiment of the optoelectronic semiconductor component, the interlayer has a refractive index that is lower than the refractive index of the material from which the useful layer is formed. The interlayer can then form a mirror for the electromagnetic radiation generated in the active layer.

In accordance with at least one embodiment of the optoelectronic semiconductor component, the reflectivity of the interlayer is increased by a layer sequence of layers having high and low refractive indices for small angles of incidence. In other words, the interlayer comprises a layer sequence of layers alternately having high and low refractive indices, which can form a Bragg mirror structure, for example.

In accordance with at least one embodiment of the optoelectronic semiconductor component, the interlayer is embodied such that it is particularly smooth on the side facing the component structure. Such a smooth interlayer enables a particularly good reflectivity of the interlayer.

In accordance with at least one embodiment of the optoelectronic semiconductor component, that side of the interlayer which faces the carrier substrate is embodied such that it is rough. This enables a good transmission of electromagnetic radiation in a direction toward the radiation exit area of the semiconductor component. This can be attributed to the fact that such a rough interface of the interlayer reduces the probability of total reflection at the interlayer.

In accordance with at least one embodiment of the optoelectronic semiconductor component, the interlayer mediates an electrical contact between the carrier substrate and the component structure. The interlayer then contains or consists for example of a transparent conductive oxide (TCO), for example ITO (indium tin oxide) or ZnO.

In accordance with at least one embodiment of the optoelectronic semiconductor component, the interlayer is at least partly transmissive to the electromagnetic radiation generated in the active layer. By way of example, the refractive index of the interlayer is for this purpose matched to the refractive index of the material from which the useful layer is formed, and/or the material from which the carrier substrate is formed. In other words, the refractive index of the interlayer is then approximately equal to the refractive index of the material from which the useful layer is formed, and/or approximately equal to the refractive index of the material from which the carrier substrate is formed. Approximately equal to means that the refractive index of the interlayer deviates by at most 20% from the refractive index of the material, preferably at most 10%, particularly preferably at most 5%, from the refractive index of the material of the useful layer and/or of the carrier substrate.

In accordance with at least one embodiment of the optoelectronic semiconductor component, a radiation exit area of the optoelectronic semiconductor component is roughened. Such a roughening can be effected for example by means of in situ roughening during the epitaxy through V-shaped openings that preferably occur at dislocations. A further possible technique for roughening the radiation exit area is the formation of small mesas on the radiation exit area. In other words, mesa structures are produced on the radiation exit area by means of epitaxial growth or etching.

In accordance with at least one embodiment, a highly transparent contact layer is applied at least to one side of the optoelectronic semiconductor component. The highly transparent contact layer can for example contain or consist of a transparent conductive oxide.

In accordance with at least one embodiment, the semiconductor component is embodied in the manner of a flip-chip. In this case, the component structure is preferably provided with a reflective electrode. That side of the carrier substrate which is remote from the component structure is then preferably roughened and structured, as described further above, in order to improve the coupling out of light through the substrate. In other words, the radiation exit area of the optoelectronic semiconductor component is formed at least in places by that side of the carrier substrate which is remote from the component structure.

In accordance with at least one embodiment, that side of the carrier substrate which is remote from the component structure is reflectively mirror-coated, such that the electromagnetic radiation generated in the active layer is reflected. In this case, at least part of the radiation exit area is provided by that side of the component structure which is remote from the carrier substrate.

In accordance with at least one embodiment of the optoelectronic semiconductor component, the interlayer comprises a dielectric mirror or forms such a dielectric mirror.

In accordance with at least one embodiment of the optoelectronic semiconductor component, the interlayer comprises a Bragg mirror or forms such a Bragg mirror.

In accordance with at least one embodiment of the optoelectronic semiconductor component, the interlayer contains at least one of the following materials: SiN, $SiO_2$, $Si_3N_4$, $Al_2O_3$, $Ta_2O_5$, $HfO_2$.

In accordance with at least one embodiment of the optoelectronic semiconductor component, the interlayer comprises a Bragg mirror or forms a Bragg mirror that contains a multiplicity of alternate first and second layers. In this case, the first layers are preferably formed from $SiO_2$ and/or $Al_2O_3$ and the second layers are preferably formed from $Ta_2O_5$ and/or $HfO_2$.

In accordance with at least one embodiment, the interlayer embodied as a dielectric mirror or Bragg mirror is a bonding layer that mediates adhesion between the carrier substrate and the component structure of the optoelectronic semiconductor component. In other words, the interlayer performs a double function in this embodiment: it serves for reflecting the electromagnetic radiation generated in the active layer of the optoelectronic semiconductor component during operation, and it mediates mechanical adhesion between the carrier substrate and the component structure.

In accordance with at least one embodiment of the optoelectronic semiconductor component, the optoelectronic component comprises a coupling-out mirror arranged on that side of the component structure which is remote from the interlayer. By way of example, the coupling-out mirror is formed by at least one of the following mirrors: metallic mirror, dielectric mirror, Bragg mirror.

In accordance with at least one embodiment of the optoelectronic semiconductor component, the coupling-out mirror comprises a Bragg mirror containing a multiplicity of alternate first and second layers. In this case, the first layers are preferably formed from $SiO_2$ and/or $Al_2O_3$ and the second layers are preferably formed from $Ta_2O_5$ and/or $HfO_2$.

In this case, it is possible, in particular, for the interlayer embodied as a mirror and the coupling-out mirror, in accordance with at least one embodiment of the optoelectronic semiconductor component, to form a resonator for the electromagnetic radiation generated in the active layer of the component structure of the optoelectronic semiconductor component. This embodiment is particularly well suited to an RCLED or a VCSEL.

In accordance with at least one embodiment of the optoelectronic semiconductor component, the distance between the interlayer and the coupling-out mirror is at most 10 μm, preferably at most 3 μm, particularly preferably at most 2 μm.

In accordance with at least one embodiment of the optoelectronic semiconductor component, a contact layer comprising or consisting of a transparent conductive oxide is arranged between the component structure and the coupling-out mirror. By way of example, the contact layer contains or consists of ITO. In other words, a contact layer containing or consisting of a transparent conductive oxide is arranged between that side of the component structure which is remote from the interlayer and the coupling-out mirror. Preferably, the component structure and the coupling-out mirror in each case directly adjoin said contact layer.

In accordance with at least one embodiment of the optoelectronic semiconductor component, the thickness of the contact layer arranged between component structure and coupling-out mirror fulfils the following relationship: $d=(m\lambda/2)/n_{KS}$. In this case, d is the thickness of the contact layer, $\lambda$ is the wavelength of the electromagnetic radiation generated in the active layer, $n_{KS}$ is the refractive index of the material of the contact layer, and m is a natural number $\geq 1$.

A method for producing an optoelectronic semiconductor component is furthermore specified.

In accordance with at least one embodiment of the method, the method comprises growing an active layer onto a useful layer. The useful layer is for example a layer of GaN having a particularly low dislocation density.

In accordance with at least one embodiment of the method for producing an optoelectronic semiconductor component, the method comprises providing a carrier substrate. The carrier substrate can be for example a cost-effective GaN substrate having a relatively high dislocation density.

In accordance with at least one embodiment of the method, the method comprises connecting the carrier substrate to a useful substrate by means of an interlayer. The useful substrate is a thick, dislocation-poor GaN substrate, for example.

In accordance with at least one embodiment of the method, the method comprises producing a fracture nucleation layer in the useful substrate. By way of example, said fracture nucleation layer can be effected by means of the implantation of hydrogen ions into the useful substrate. As a result, a fracture nucleation layer is formed, along which part of the useful substrate can be stripped away in a subsequent method step, such that a useful layer remains which is connected to the carrier substrate via the interlayer. By way of example, the useful layer can be stripped away from the remaining useful substrate by heat treatment. Such a method for producing a quasi-substrate with a useful layer is described for example in the document WO 2005/004231, the disclosure content of which in this regard is hereby expressly incorporated by reference.

In accordance with at least one embodiment of the method for producing an optoelectronic semiconductor component, the method comprises the following steps:
  providing a carrier substrate,
  connecting the carrier substrate to a useful substrate by means of an interlayer,
  producing a fracture nucleation layer in the useful substrate,
  stripping away part of the useful substrate, such that a useful layer remains which is connected to the carrier substrate, and
  growing a component structure comprising an active layer onto the useful layer.

BRIEF DESCRIPTION OF THE DRAWINGS

The optoelectronic semiconductor component described here and the method for producing the optoelectronic semiconductor component are explained in more detail below on the basis of exemplary embodiments and the associated figures. In the exemplary embodiments and figures, identical or identically acting constituent parts are in each case provided with the same reference symbols. The elements illustrated should not be regarded as true to scale; rather, individual elements may be illustrated with an exaggerated size in order to afford a better understanding.

DETAILED DESCRIPTION OF THE DRAWINGS

Figure 1:
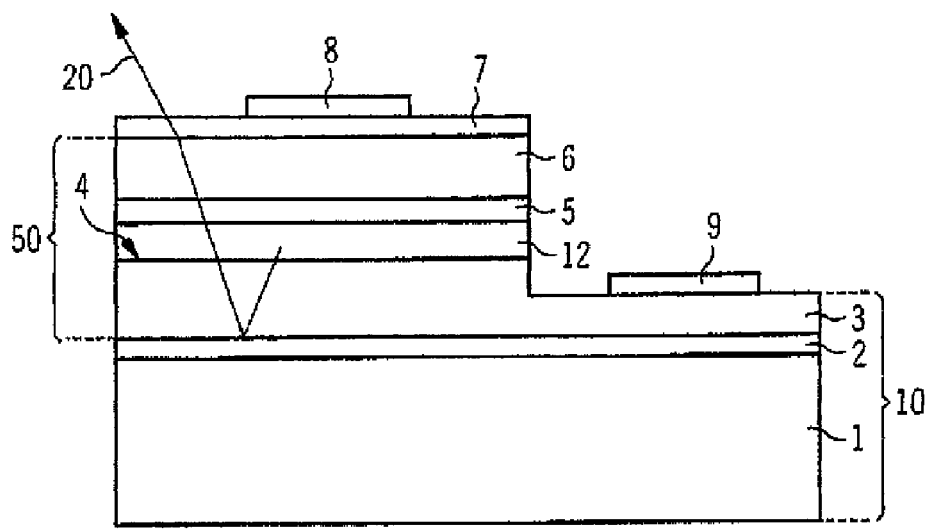
FIG. 1 shows a schematic sectional illustration of a first exemplary embodiment of an optoelectronic semiconductor component described here.

FIG. 1 shows a schematic sectional illustration of a first exemplary embodiment of an optoelectronic semiconductor component described here.

The optoelectronic semiconductor component comprises a carrier substrate 1. The carrier substrate 1 is formed from a cost-effective GaN having a relatively high dislocation density.

An interlayer 2 is applied to the carrier substrate 1, said interlayer having a lower refractive index and good adhesion on GaN. By way of example, the interlayer 2 is formed from $SiO_2$. The thickness of the interlayer 2 is preferably at least 100 nm.

A component structure 50 is applied to the interlayer 2. The component structure 50 comprises a useful layer 3, which consists of GaN and is formed at least partly from material that was separated from a useful substrate. The dislocation density of the useful layer is less than $10^8$ per $cm^2$, preferably less than $10^7$ per $cm^2$. The useful layer 3 has a separating layer 4 remote from the carrier substrate 1. The useful layer 3 was separated from the useful substrate along the separating layer 4.

The useful layer 3 is succeeded by an electron injection layer 12. The electron injection layer 12 is for example a layer consisting of n-AlInGaN. In this case, it is also possible for the useful layer 3 to form the electron injection layer 12. In this case, the useful layer 3 is separated from an n-AlInGaN useful substrate.

The electron injection layer 12 is succeeded by an active layer 5. The active layer 5 comprises at least one structure provided for generating radiation. By way of example, the active layer 5 can contain a pn junction, a heterostructure, a quantum well structure and/or a multiple quantum well structure.

The active layer 5 is succeeded by a second conductive layer—for example a p-AlInGaN hole injection layer 6—, which is preferably roughened and/or structured on its side remote from the active layer 5 in order to increase the probability of a radiation exit through the hole injection layer 6. For this purpose, it is also possible for small mesas to be structured in the hole injection layer 6.

The hole injection layer 6 is succeeded by a contact layer 7, which for example contains or consists of a transparent conductive oxide, such as ITO.

A bonding pad 8 is applied to the contact layer 7, by means of which bonding pad 8 electrical contact can be made with the component for example by wire contact-connection.

In the exemplary embodiment described in conjunction with FIG. 1, the useful layer 3 or the electron injection layer 12 is uncovered at least in places from the side remote from the carrier substrate. A bonding pad 9 is applied to the useful layer 3 uncovered in this way, said bonding pad serving for n-side contact-connection of the optoelectronic semiconductor component. The optoelectronic semiconductor component described in conjunction with FIG. 1 is a light emitting diode, for example.

As an alternative to the embodiment described in conjunction with FIG. 1, the carrier substrate 1 can be electrically insulating and transparent. By way of example, the carrier substrate 1 then consists of sapphire. The interlayer 2 then preferably has a refractive index that is less than that of sapphire.

As an alternative, it is furthermore possible for n- and p-conducting layers to be interchanged. In other words, the carrier substrate can also adjoin a p-conducting layer.

As an alternative it is furthermore possible for the component to be embodied as a flip-chip component wherein a highly reflective mirror is applied to the hole injection layer 6 or the contact layer 7.

In many LEDs, for example UV-LEDs based on gallium nitride, the internal efficiency depends greatly on the defect density. Said defect density is substantially determined by the substrate. Thus, defect densities in the heteroepitaxy of gallium nitride on sapphire or of gallium nitride on silicon carbide of $10^8$ to $10^{10}$ per $cm^2$ are possible.

The second factor for the device efficiency is the coupling out of the light beams generated in the semiconductor layer from the semiconductor into the surroundings. This coupling out is limited by reflections at the interface and by angles of total reflection for the transition in-between the different materials.

Efficient coupling out of light is achieved by means of thin-film technology. The principle is to give the generated light beams an increased probability for the coupling out of light. For this purpose, the radiation exit area is structured or roughened in order to obtain a change in angle in the case of a reflection, and the opposite side is reflectively mirror-coated. The structure between surface and mirror is preferably kept as thin as possible in order to minimize absorption in the material. The laser lift-off method for substrate separation in conjunction with eutectic bonding is dominant nowadays in thin-film chip technology. A wafer bonding process combined with grinding and etching away the master substrate is possible as an alternative. Light emitting diode chips of thin-film design are described for example in the documents WO 02/13281 A1 and EP 0 905 797 A2, the disclosure content of which with regard to the thin-film design is hereby expressly incorporated by reference.

A further possibility of obtaining high coupling out of light involves epitaxial structures on a highly transparent substrate (for example sapphire) in conjunction with highly transparent front side current spreading layers (contacts) and in conjunction with changes in the paths of the reflected light, such as structuring or roughening of surfaces and/or interfaces. On gallium nitride substrates, however, the efficiency of such structuring is greatly reduced since gallium nitride is highly absorbent primarily for radiation in the UV range.

Figure 2:
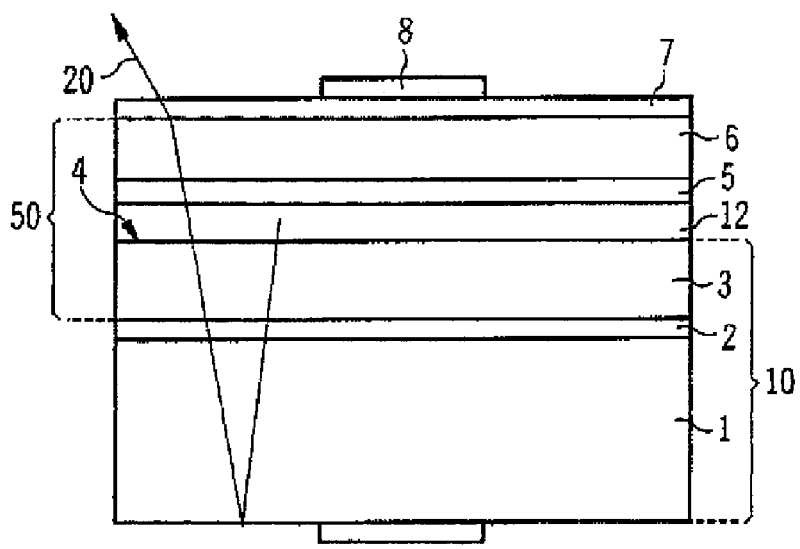
FIG. 2 shows a schematic sectional illustration of a second exemplary embodiment of an optoelectronic semiconductor component described here.

FIG. 2 shows a second exemplary embodiment of an optoelectronic semiconductor component described here, in a schematic sectional illustration.

In this exemplary embodiment, the interlayer 2 is embodied such that it is electrically conductive, and produces a contact to the component structure 50. The interlayer 2 consists of or contains a transparent conductive oxide such as ITO or ZnO. That side of the carrier substrate 1 which is remote from the component structure 50 is then preferably embodied such that it is reflective to the electromagnetic radiation 20 generated in the active layer 5.

In this case, the active layer is preferably suitable for generating electromagnetic radiation 20 having a wavelength of less than 380 nm. The useful layer 3 then preferably consists of or contains an AlGaN. Such a useful layer can be grown epitaxially onto a GaN useful substrate. This layer relaxes during rebonding onto the carrier substrate after being stripped from the useful substrate, such that a low-defect AlGaN useful layer 3 integrated into the component structure 50 is available for the epitaxy of the subsequent layers of the component structure 50. Such a useful layer 3 can then simultaneously form an electron injection layer 12.

It is furthermore possible for the useful layer 3 to consist of AlGaInN or to contain this material.

In order to produce the optoelectronic semiconductor component as has been described for example in conjunction with FIG. 1 or FIG. 2, firstly a quasi-substrate 10 is produced. For this purpose, for example a high-quality GaN useful substrate is provided, which preferably has a defect density of less than $10^8$ per $cm^2$, particularly preferably of less than $10^7$ per $cm^2$. Optionally, there is already situated on the GaN useful substrate an epitaxially grown layer or layer sequence, which can contain at least one of the following materials: GaN, AlGaN, InGaN, AlInGaN.

A fracture nucleation layer is produced in the GaN useful substrate, said layer extending parallel to a main area of the gallium nitride substrate in a lateral direction. The fracture nucleation layer is preferably produced by the implantation of hydrogen ions from one side of the GaN useful substrate.

Subsequently, before or after the production of the fracture nucleation layer the GaN useful substrate is bonded onto a carrier substrate 1. The fracture nucleation layer is subsequently caused to form a lateral fracture. This can be done by heat treatment, for example. This results in a useful layer 3 that is transferred from the useful substrate to the carrier substrate 1.

The useful layer 3 is connected to the carrier substrate 1 by means of an interlayer 2.

Figure 3:
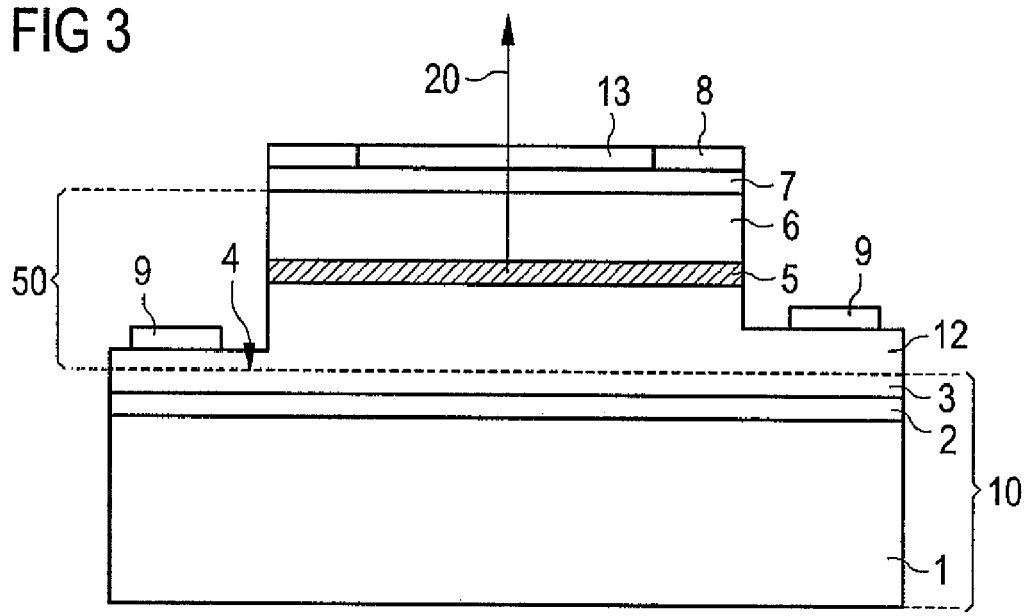
FIG. 3 shows a schematic sectional illustration of a third exemplary embodiment of an optoelectronic semiconductor component described here.

FIG. 3 shows a third exemplary embodiment of an optoelectronic semiconductor component described here in a schematic sectional illustration.

The optoelectronic semiconductor component once again comprises a carrier substrate 1 formed from cost-effective GaN, for example, which can have a relatively high dislocation density of greater than $10^9$ per $cm^2$. As an alternative, the carrier substrate 1 can also be formed from sapphire. An interlayer 2 is applied to the carrier substrate 1, said interlayer mediating adhesion between the carrier substrate 1 and a component structure 50. In the exemplary embodiment in FIG. 3, the interlayer 2 is a Bragg mirror. The interlayer 2 then comprises a Bragg mirror or forms a Bragg mirror, which contains a multiplicity of alternate first and second layers. In this case, the first layers are preferably formed from $SiO_2$ and/or $Al_2O_3$ and the second layers are preferably formed from $Ta_2O_5$ and/or $HfO_2$.

The component structure 50 comprises a useful layer 3, which consists of high-quality GaN and is separated from a useful substrate. The dislocation density of the useful layer 3 is less than $10^8$ per $cm^2$, preferably less than $10^7$ per $cm^2$. The interface between the useful layer 3 and the rest of the component structure 50 is ideally free of imperfections. The useful layer 3 has a separating layer 4 remote from the carrier substrate 1. The useful layer 3 is separated from the useful substrate for example by a stripping process along the separating layer 4 after the bonding of the useful substrate onto the carrier substrate 1 by means of the interlayer 2.

The useful layer 3 is succeeded by a first conductive layer, which is for example an electron injection layer 12. The electron injection layer 12 contains or consists of n-AlInGaN in the exemplary embodiment in FIG. 1.

The electron injection layer 12 is succeeded by an active layer 5 comprising at least one structure provided for generating radiation.

The active layer 5 is succeeded by a second conductive layer—for example a hole injection layer 6. The hole injection layer 6 contains or consists of p-doped AlInGaN, for example.

The hole layer 6 is succeeded by a contact layer 7. The contact layer 7 is formed for example from ITO (indium tin oxide). The thickness of the contact layer 7 is preferably a multiple of half the wavelength of the electromagnetic radiation 20 generated in the active layer divided by the refractive index of the material of the contact layer 7. Particularly preferably, the thickness of the contact layer 7 amounts to the wavelength of the electromagnetic radiation 20 generated in the active layer 5 divided by the refractive index of the material of the contact layer 7. The contact layer 7 can optionally be combined with a p+/n+ tunnel junction.

A metallic contact 8 is applied to that side of the contact layer 7 which is remote from the active layer 5, said contact being embodied in ring-shaped fashion, for example. Into the center of the ring, a coupling-out mirror 13 is applied to the contact layer 7. The coupling-out mirror 13 forms, with the mirror formed by the interlayer 2, a resonator for the electromagnetic radiation 20 generated in the active layer 5. The coupling-out mirror 13 is embodied for example as a dielectric mirror, preferably as a Bragg mirror. In terms of its construction, the coupling-out mirror 13 can correspond for example to the mirror of the interlayer 2. The coupling-out mirror 13 then comprises a Bragg mirror or forms a Bragg mirror, which contains a multiplicity of alternate first and second layers. In this case, the first layers are preferably formed from $SiO_2$ and/or $Al_2O_3$ and the second layers are preferably formed from $Ta_2O_5$ and/or $HfO_2$.

At least one metallic bonding pad 9 is applied to a surface—uncovered for example by means of a mesa etch—of the electron injection layer 12, by means of which bonding pad electrical contact can be made with the optoelectronic semiconductor component on the n side.

The optoelectronic semiconductor component in FIG. 1 preferably forms an RCLED or a VCSEL.

The principle of the RCLED or of the VCSEL is embedding a light-generating layer between two mirrors. The mirrors can be metal or dielectric layers.

Inter alia, a method is presented here for VCSEL and RCLED based on nitride which enables the resonant embedding of the active layer 5 between two mirrors 2, 13 with a small distance and simultaneously comprises a low-defect crystal structure.

Inter alia, a novel method is presented which enables, from lattice-matched, low-dislocation epitaxy, an RCLED or VCSEL structure having a small number of modes as a result of a small mirror distance. Light can be coupled out optimally through the substrate.

The substrate is prepared for a later stripping process for example by means of hydrogen implantation. The substrate is planarized, if appropriate, and a Bragg mirror is applied to the substrate. Suitable for the Bragg mirror are for example $SiO_2$—$TiO_2$ layer sequences or $SiO_2$—$Ta_2O_5$ or $SiO_2$—$HfO_2$ or else $Al_2O_3$ instead of $SiO_2$. If appropriate, an $SiO_2$ terminating layer is advantageous. The $SiO_2$ layer is bonded directly onto a carrier substrate, for example sapphire or cost-effective—if appropriate defect-rich—GaN. A substrate useful layer 3 with the dielectric layers of the interlayer 2 is separated from the substrate by blistering and lateral cracking. The order of the steps can be varied.

The LED or laser structure is epitaxially grown onto the rebonded useful layer 3 in lattice-matched fashion. The layer thickness is chosen such that the optical path–=thickness× refractive index–amounts to a multiple of half the emission wavelength–lambda/2. The preferred thickness is less than 10 µm, preferably less than 3 µm.

Afterward, the chip structure is processed and the front side is reflectively mirror-coated. The reflective mirror-coating can be metallic for example composed of or comprising silver or dielectric. In this case, a highly transparent contact layer by means of, for example, ITO in combination with an overlying dielectric mirror is preferred. The thickness of the contact layer is preferably a multiple of (wavelength/2)/refractive index, in particular 1×wavelength/refractive index.

The novel device consists of an AlGaInN layer assembly having a light-generating active layer and a dislocation density of less than $10^8$ per $cm^2$. The layer assembly lies at least in part between two mirrors, and the layer thickness between the mirrors 2, 13 is less than 2 µm, preferably less than 10×emission wavelength/(refractive index of the material between the mirrors 2, 13).

Figure 4:
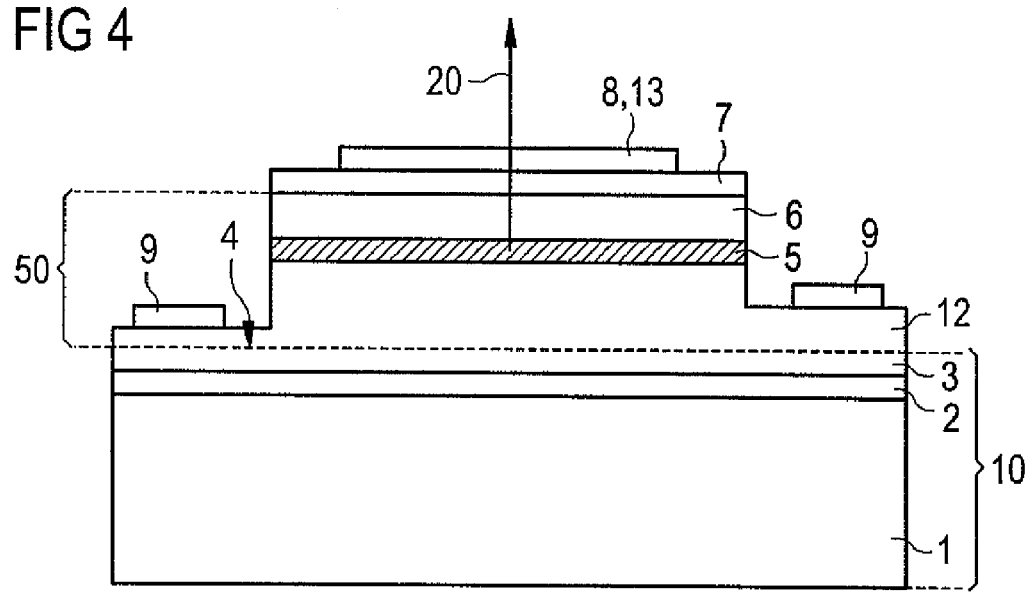
FIG. 4 shows a schematic sectional illustration of a fourth exemplary embodiment of an optoelectronic semiconductor component described here.

FIG. 4 shows a fourth exemplary embodiment of an optoelectronic semiconductor component described here, in a schematic sectional illustration. In contrast to the exemplary embodiment described in conjunction with FIG. 3, the coupling-out mirror 13 in this exemplary embodiment is formed by a metal mirror that forms an ohmic contact with the contact layer 7. That is, the coupling-out mirror 13 is constituted by metallic contact 8. As a result, alongside its optical properties, the coupling-out mirror 13 also serves for impressing current into the optoelectronic semiconductor component.

Figure 5:
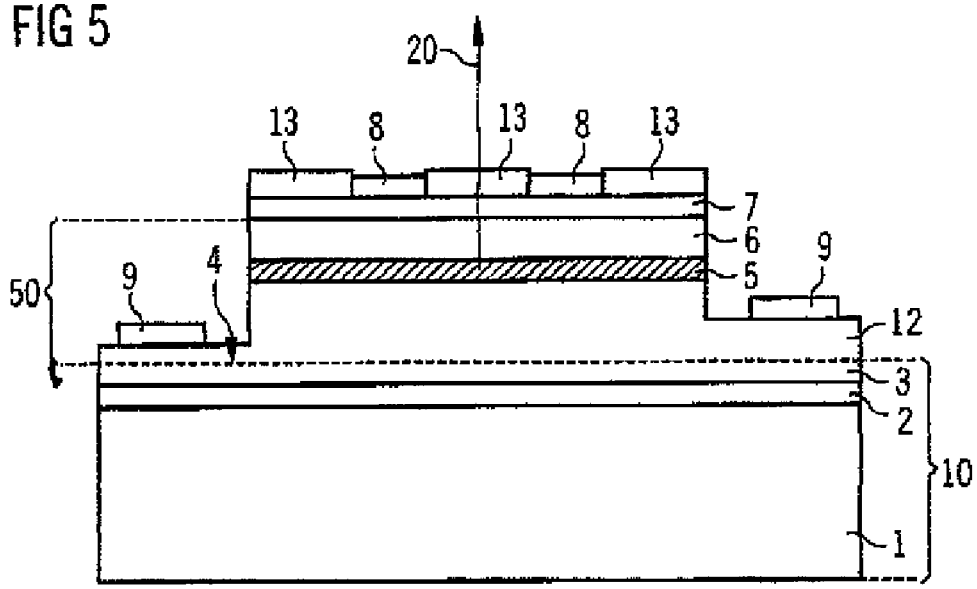
FIG. 5 shows a schematic sectional illustration of a fifth exemplary embodiment of an optoelectronic semiconductor component described here.

FIG. 5 shows a fifth exemplary embodiment of an optoelectronic semiconductor component described here, in a schematic sectional illustration. In contrast to the exemplary embodiment described in conjunction with FIG. 3, in this exemplary embodiment the metallic contact 8 is embodied in ring-shaped fashion in such a way that it is not situated at the central area of the component. The area, not covered by the metallic contact 8, of that side of the contact layer 7 which is remote from the active layer 5 is covered with a coupling-out mirror 13, which is formed by a Bragg mirror, for example.

Figure 6:
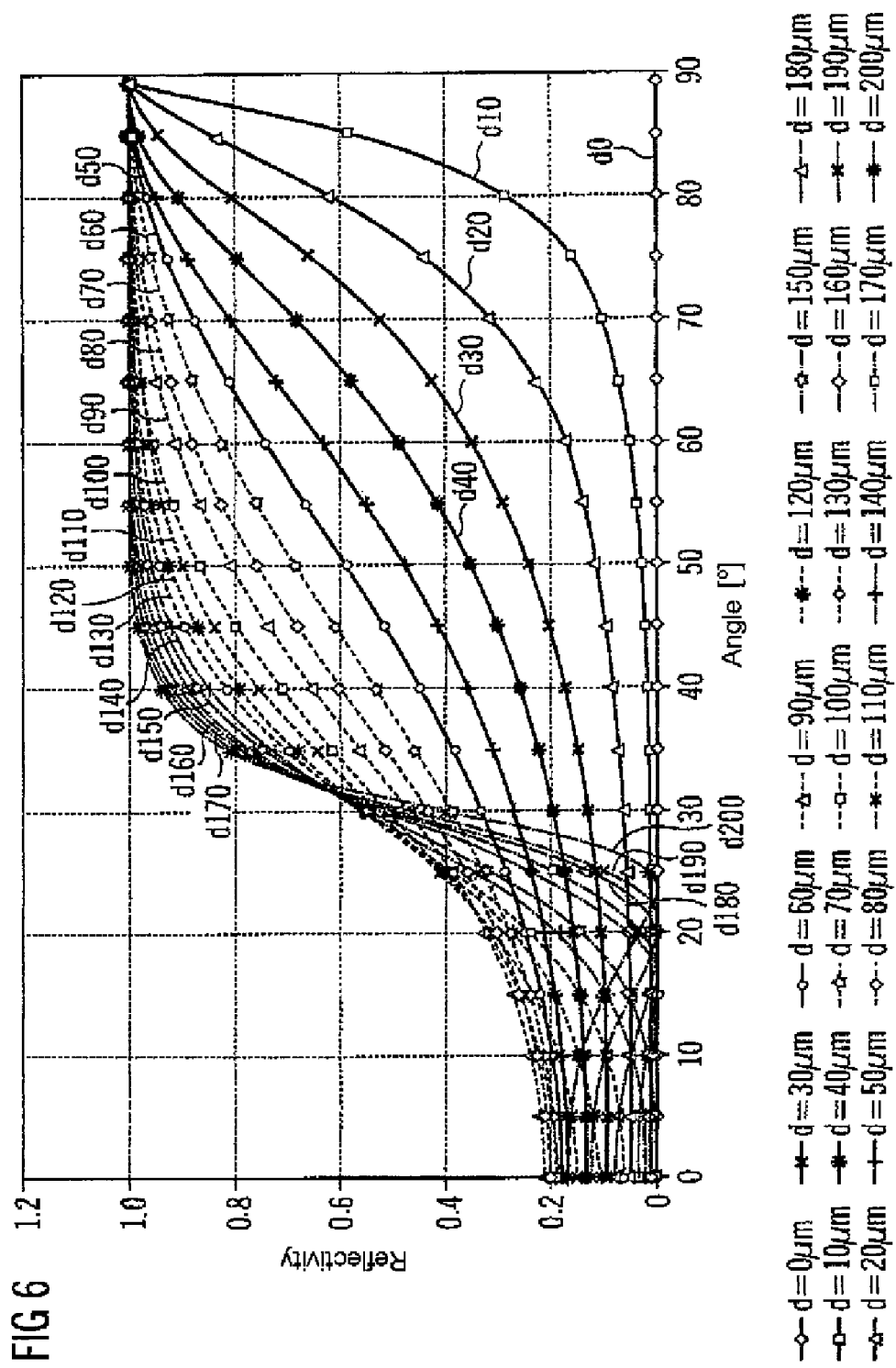
FIG. 6 shows a schematic plotting of the reflectivity at the interlayer.

FIG. 6 shows the reflectivity at the interface between an $SiO_2$ interlayer 2 and GaN as a function of the thickness d of the interlayer 2 for a wavelength of the radiation generated by the active layer 5 of 460 nm. In this case, the reflectivity was determined for example for an optoelectronic semiconductor component as was described in conjunction with FIG. 1.

The interlayer 2 proves to be particularly advantageous if the electromagnetic radiation generated in the active layer 5 is greatly absorbed in the carrier substrate 1. This is the case in particular for emission wavelengths of less than 380 nm in the case of a GaN carrier substrate.

Figure 7:
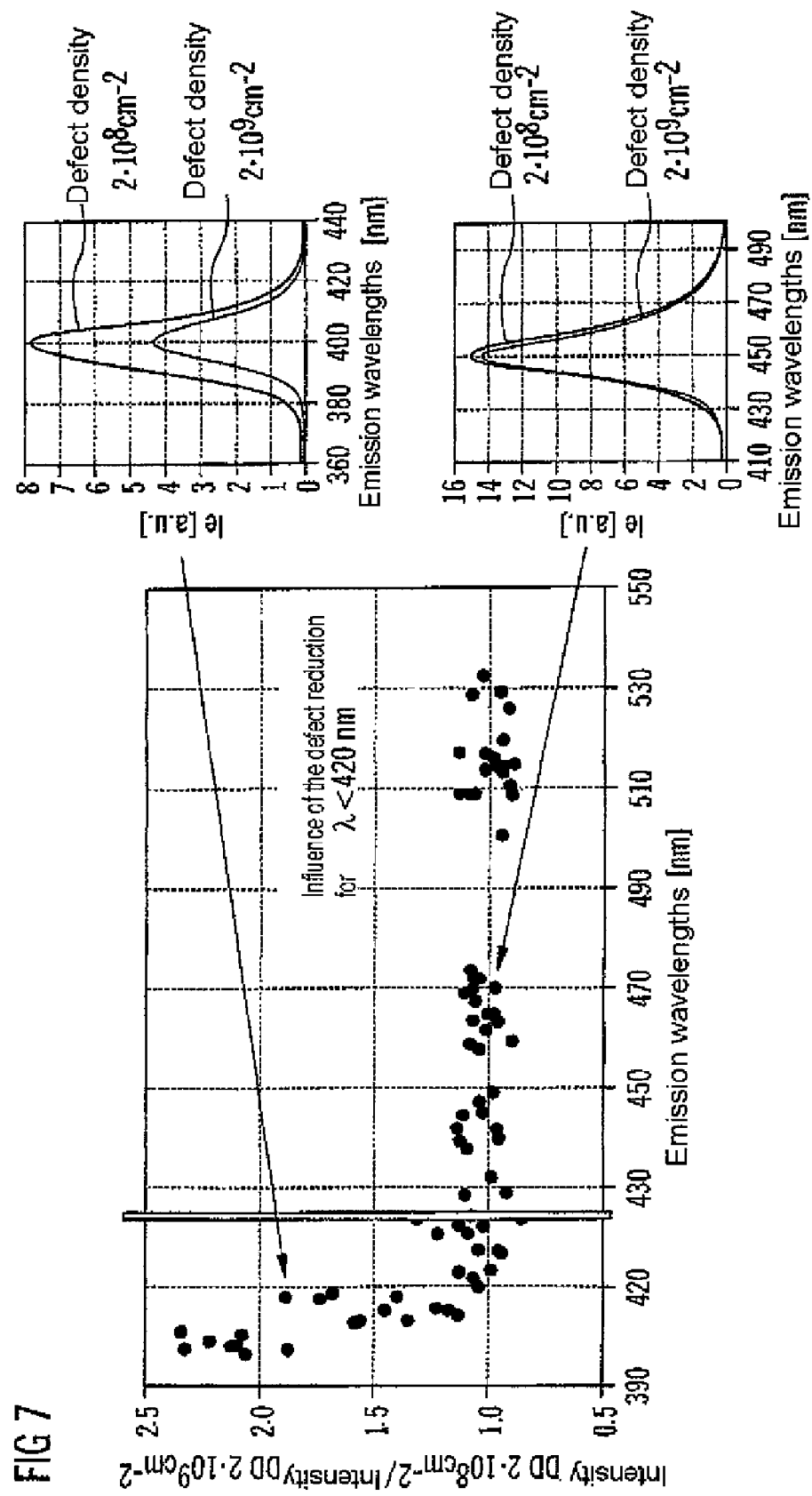
FIG. 7 shows a schematic plotting of the intensity of the radiation emitted by the component.

FIG. 7 shows the intensity ratio of the electromagnetic radiation generated by the active layer 5 for a defect density (DD) of $2\times10^8$ per $cm^2$ in comparison with a defect density of $2\times10^9$ per $cm^2$. Primarily for wavelengths of less than 420 nm, the defect density reduced on account of the useful layer 3 has a particularly advantageous effect, for example in the case of a component as was described in conjunction with FIG. 1.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic semiconductor component, comprising:
   a carrier substrate;
   an interlayer that mediates adhesion between the carrier substrate and a component structure, wherein the component structure comprises an active layer provided for generating radiation;
   a useful layer arranged between the interlayer and the active layer, wherein the useful layer has a separating area remote from the carrier substrate;
   a coupling-out mirror arranged on that side of the component structure which is remote from the interlayer; and
   a contact layer comprising a transparent conductive oxide that is arranged between the component structure and the coupling-out mirror, wherein the following relationship is fulfilled:

$$d=(m\lambda/2)/n_{KS},$$

wherein d is the thickness of the contact layer, λ is the wavelength of the electromagnetic radiation generated in the active layer, $n_{KS}$ is the refractive index of the material of the contact layer, and m is a natural number.

2. The optoelectronic component as claim in claim 1, wherein the interlayer is at least partly transmissive to the electromagnetic radiation generated in the active layer.

3. The optoelectronic semiconductor component as claimed in claim 2, wherein the interlayer contains a transparent conductive oxide.

4. The optoelectronic semiconductor component as claimed in claim 1, wherein the refractive index of the interlayer is approximately equal to the refractive index of the material from which the useful layer is formed, and/or approximately equal to the refractive index of the material from which the carrier substrate is formed.

5. The optoelectronic semiconductor component as claimed in claim 1, wherein the interlayer has a refractive index that is lower than the refractive index of the material from which the useful layer is formed.

6. The optoelectronic semiconductor component as claimed in claim 1, wherein the interlayer contains at least one of the following materials: $SiO_2$, $Al_2O_3$, $Ta_2O_5$, $HfO_2$.

7. The optoelectronic semiconductor component as claimed in claim 1, wherein the interlayer is electrically insulating.

8. The optoelectronic semiconductor component as claimed in claim 1, wherein the interlayer comprises or is a dielectric mirror.

9. The optoelectronic semiconductor component as claimed in claim 1, wherein the interlayer comprises or is a Bragg mirror.

10. The optoelectronic semiconductor component as claimed in claim 1, wherein the interlayer is a bonding layer.

11. The optoelectronic semiconductor component as claimed in claim 1, wherein the interlayer mediates an electrical contact between the carrier substrate and the component structure.

12. The optoelectronic semiconductor component as claimed in claim 1, wherein the distance between the interlayer and the coupling-out mirror is at most 10 μm.

* * * * *